(12) United States Patent
Mochizuki et al.

(10) Patent No.: US 8,598,594 B2
(45) Date of Patent: Dec. 3, 2013

(54) SEMICONDUCTOR DEVICE AND ITS FABRICATION METHOD

(75) Inventors: Kazuhiro Mochizuki, Tokyo (JP); Takashi Ishigaki, Hino (JP); Akihisa Terano, Hachioji (JP); Tomonobu Tsuchiya, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/366,313

(22) Filed: Feb. 4, 2012

(65) Prior Publication Data

US 2012/0228626 A1 Sep. 13, 2012

(30) Foreign Application Priority Data

Mar. 7, 2011 (JP) .................... 2011-048728

(51) Int. Cl.
*H01L 29/205* (2006.01)
*H01L 21/20* (2006.01)

(52) U.S. Cl.
USPC ..... 257/76; 257/201; 257/E29.091; 257/E21.09; 438/478

(58) Field of Classification Search
None
See application file for complete search history.

(56) References Cited

U.S. PATENT DOCUMENTS

| 8,043,906 | B2* | 10/2011 | Beach ................ 438/172 |
| 8,174,048 | B2* | 5/2012 | Beach ................ 257/192 |
| 8,373,207 | B2* | 2/2013 | Kusunoki et al. ......... 257/256 |
| 2007/0066020 | A1* | 3/2007 | Beach ................ 438/285 |
| 2009/0114948 | A1* | 5/2009 | Ishida ................ 257/183 |
| 2010/0127652 | A1* | 5/2010 | Morita et al. ........... 318/400.27 |

FOREIGN PATENT DOCUMENTS

| JP | 2006108676 A | * | 4/2006 |
| JP | 2009-117485 A | | 5/2009 |

OTHER PUBLICATIONS

Ishida, H.; Shibata, D.; Matsuo, H.; Yanagihara, M.; Uemoto, Y.; Ueda, T.; Tanaka, T.; Ueda, D., "GaN-based natural super junction diodes with multi-channel structures," Electron Devices Meeting, 2008. IEDM 2008. IEEE International , vol., No., pp. 1,4, Dec. 15-17, 2008.*
Bahat-Treidel, E.; Hilt, O.; Zhytnytska, R.; Wentzel, A.; Meliani, C.; Wurfl, Joachim; Trankle, G., "Fast-Switching GaN-Based Lateral Power Schottky Barrier Diodes With Low Onset Voltage and Strong Reverse Blocking," Electron Device Letters, IEEE , vol. 33, No. 3, pp. 357,359, Mar. 2012.*
Shibata, D.; Kaibara, K.; Murata, T.; Yamada, Y.; Morita, T.; Anda, Y.; Ishida, M.; Ishida, H.; Ueda, T.; Tanaka, T.; Ueda, D., "GaN-based multi-junction diode with low reverse leakage current using P-type barrier controlling layer," Electron Devices Meeting (IEDM), 2011 IEEE International , vol., No., pp. 26.2.1,26.2.4, Dec. 5-7, 2011.*
Tajima, Masafumi, Junji Kotani, and Tamotsu Hashizume. "Effects of Surface Oxidation of AlGaN on DC Characteristics of AlGaN/GaN High-Electron-Mobility Transistors." Japanese Journal of Applied Physics 48.No. 2 (2009): 020203.*

* cited by examiner

*Primary Examiner* — Thomas L Dickey
*Assistant Examiner* — Joseph Schoenholtz
(74) *Attorney, Agent, or Firm* — Miles & Stockbridge P.C.

(57) ABSTRACT

In a semiconductor device including a stack structure having heterojunction units formed by alternately stacking GaN (gallium nitride) films and barrier films which are different in forbidden band width, a first electrode formed in a Schottky barrier contact with one sidewall of the stack structure, and a second electrode formed in contact with the other sidewall, an oxide film is interposed between the first electrode and the barrier films. Therefore, the reverse leakage current is prevented from flowing through defects remaining in the barrier films due to processing of the barrier films, so that a reverse leakage current of a Schottky barrier diode is reduced.

16 Claims, 10 Drawing Sheets

SEMICONDUCTOR DEVICE AND ITS FABRICATION METHOD

CROSS-REFERENCE TO RELATED APPLICATION

The present application claims priority from Japanese Patent Application No. 2011-048728 filed on Mar. 7, 2011, the content of which is hereby incorporated by reference into this application.

TECHNICAL FIELD OF THE INVENTION

The present invention relates to a semiconductor device and its fabrication method. The present invention particularly relates to a technology effectively applied to a semiconductor device having a heterojunction unit in which the widths of forbidden band differ.

BACKGROUND OF THE INVENTION

A heterojunction unit of a barrier film and a GaN (gallium nitride) film formed of $In_xAl_yGa_{1-x-y}N$ (indium aluminum gallium nitride; $0 \leq x \leq 1$, $0 \leq y \leq 1$, $0 \leq x+y \leq 1$) which is a nitride semiconductor has a high breakdown electric field and a high sheet carrier concentration as compared with a diode constituted by a p-n junction using silicon or the like. Thus, it is proposed that, by using a diode (Schottky barrier diode) for such a heterojunction unit, the breakdown voltage is improved as compared with the diode composed of the p-n junction such as silicon so that a diode performance such as reduction of on-resistance is improved.

For example, Japanese Patent Application Laid-Open Publication No. 2009-117485 (Patent Document 1) discloses a Schottky barrier diode, which includes: a stack structure having a heterojunction unit in which a GaN layer and an AlGaN (aluminum gallium nitride) layer are stacked; a Schottky electrode that forms a Schottky barrier contact with the heterojunction unit and is formed on a first end of this stack structure; and an ohmic electrode that forms an ohmic contact with the heterojunction unit and is formed on a second end of this stack structure. However, Patent Document 1 does not mention forming of an insulating film such as an oxide film between the heterojunction unit and the Schottky electrode.

SUMMARY OF THE INVENTION

The inventors of the present invention have studied improvements of characteristics of a semiconductor device using a heterojunction unit in which semiconductor films different in forbidden band width are stacked for a diode and the like.

In conjunction with this study, the inventors have found that, when the heterojunction unit having a stack structure is processed (patterned by using dry etching), a semiconductor film (for example, an AlGaN layer) exposed at a sidewall of the heterojunction unit is apt to develop defects, thereby deteriorating the characteristics of the diode. Specifically, a leakage current is apt to be generated when a reverse bias voltage is applied to the diode including the heterojunction unit, and this raises a problem that a prescribed breakdown voltage cannot be secured.

A preferred aim of the present invention is to prevent generation of a reverse leakage current in the heterojunction unit.

The above and other preferred aims and novel characteristics of the present invention will be apparent from the description of the present specification and the accompanying drawings.

The typical ones of the inventions disclosed in the present application will be briefly described as follows.

A semiconductor device according to an invention in the present application includes: a stack structure having at least one layer of a heterojunction unit in which a first film and a second film mutually different in forbidden bandwidth are hetero-joined and stacked on a substrate; a first electrode arranged so as to contact a first sidewall of the stack structure and forms a Schottky barrier contact with the first film; and a second electrode arranged so as to contact a second sidewall opposite to the first sidewall of the stack structure, a first insulating film being interposed between the first electrode and the second electrode.

A fabrication method of a semiconductor device according to an invention in the present application includes the steps of: (a) forming a stack structure by stacking alternately and repeatedly a first film and a second film different in forbidden band width on a substrate; (b) forming a first sidewall and a second sidewall opposite to the first sidewall of the stack structure by selectively removing the stack structure; (c) forming a first insulating film on a side surface of the second film exposed to the first sidewall; (d) forming a first electrode contacting the first sidewall after the step (c), and forming a Schottky barrier contact of the first film and the first electrode; and (e) forming a second electrode contacting the second sidewall, the first insulating film being interposed between the first electrode and the second film.

The effects obtained by typical aspects of the present invention will be briefly described below.

According to the present invention, occurrence of a reverse leakage current in a diode can be prevented.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols in principle throughout the drawings for describing the embodiment, and the repetitive description thereof will be omitted.

First Embodiment

Figure 1:
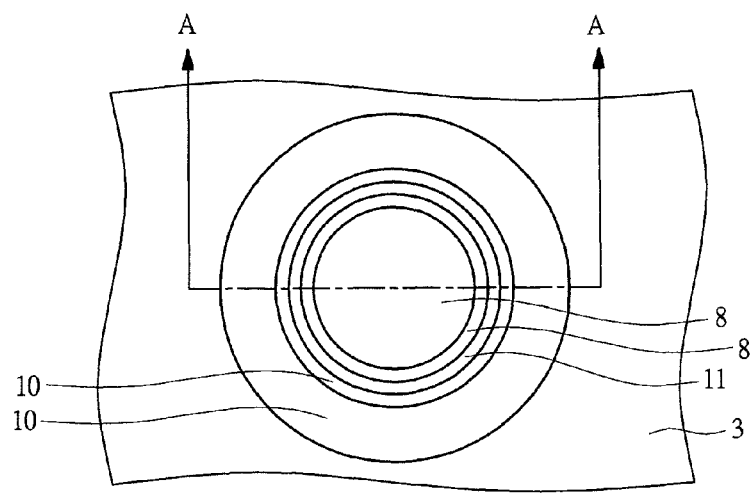
FIG. 1 is a plan view of a Schottky barrier diode that is a first embodiment of the present invention.
Figure 2:
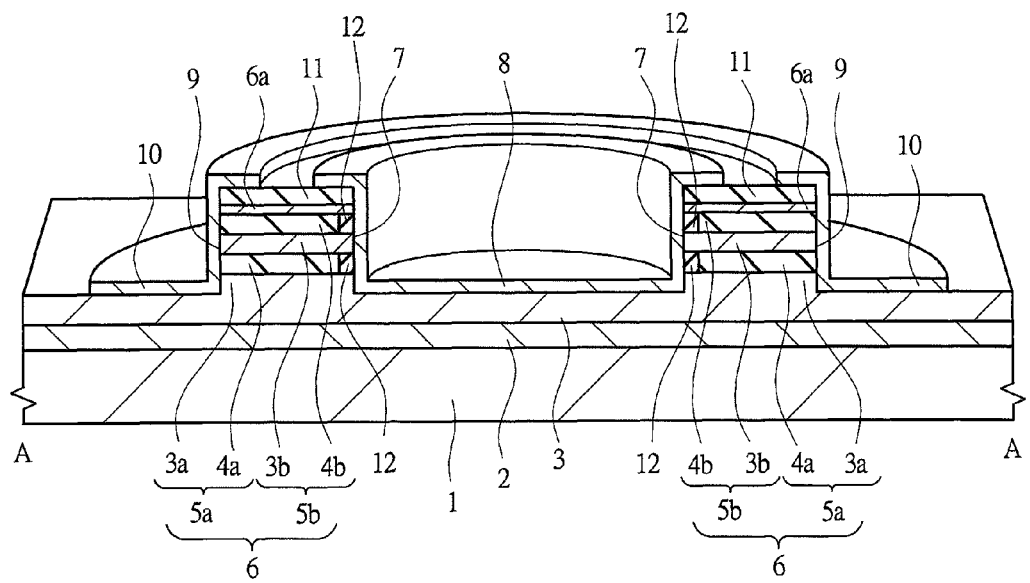
FIG. 2 is a perspective view showing a partial cutaway view of the Schottky barrier diode that is the first embodiment of the present invention.

A configuration of a semiconductor device according to a first embodiment including a Schottky barrier diode will be described with reference to FIGS. 1 and 2. FIG. 1 is a plan view of the semiconductor device according to the present embodiment. FIG. 2 is a perspective view showing a partial cutaway view of the semiconductor device according to the present embodiment. The cross-sectional view shown in the perspective view of FIG. 2 is a cross-sectional view taken along the line A-A of FIG. 1.

As shown in FIGS. 1 and 2, the semiconductor device according to the present embodiment is formed on a semiconductor substrate, and is provided with a Schottky barrier diode having a stack film annularly patterned in plan-view and electrodes formed at both sides of the stack film, respectively. Specifically, the semiconductor device according to the present embodiment includes: a substrate 1; a buffer layer 2, a GaN layer 3, a stack body (stack structure) 6, a GaN film 6a, and an insulating film 11, all of which are formed on the substrate 1 in this order from the substrate 1 side; a first electrode (Schottky electrode) 8 formed on the sidewall of the inner side of the annular stack structure 6, and a second electrode (ohmic electrode) 10 formed on the sidewall of the opposite side thereof. The substrate 1, for example, is a Si (silicon) substrate. For the substrate 1, a GaN (nitride gallium) substrate, a SiC (silicon carbide) substrate or a sapphire substrate or the like may be used in addition to the Si substrate.

The buffer layer (buffer layer, stress relaxation layer) 2 is arranged on the substrate 1, and for example, it is a film composed of an undoped AlGaN layer. The term "undoped" means that n-type or p-type impurities are not contained or even if the impurities are contained, the concentration thereof is low. This buffer layer is formed for the relaxation of the stress arising from the stacking of the substrate 1 and the GaN film 3 and the stack structure 6 on the upper part of this substrate 1. The buffer layer 2 may use an AlN layer and the like in addition to the undoped AlGaN layer, and a film having a stress reverse to the film stress (for example, a film warping) generated when stacked may be used as the buffer layer 2.

The GaN film 3 is a film formed on the buffer layer 2, and is integrated with a GaN film 3a formed in the lowest layer of the stack structure 6 formed on the GaN film 3. That is, one layer film composed of the GaN films 3 and 3a has a part of the upper part thereof annularly processed and the lower part thereof not processed. Here, a region annularly processed is the GaN film 3a, and a region not annularly processed of the lower part of the GaN film 3a is the GaN film 3. The GaN film 3a constitutes a part of the stack structure 6.

The stack structure 6 has a structure in which semiconductor films different in forbidden band width are repeatedly stacked. The semiconductor film constituting the stack structure 6 is a compound semiconductor, and for example, can use a GaN film that is a nitride-based compound semiconductor, an $In_xAl_yGa_{1-x-y}N$ ($0 \leq x \leq 1$, $0 \leq y \leq 1$, $0 \leq x+y \leq 1$) film, or the like. As a specific example, the stack structure 6, for example, can be formed into a stack structure having the GaN film 3a, an $Al_{0.25}Ga_{0.75}N$ film (barrier film) 4a, a GaN film 3b, and an $Al_{0.25}Ga_{0.75}N$ film (barrier film) 4b in this order from the lower layer to the upper layer. The members of the GaN films 3a, 3b may not be GaN films, but may be InAlGaN films. However, as described below, since the GaN films 3a, 3b are layers in which electrons two-dimensionally travel, no alloy scattering is existent, and it is desirable to use the GaN film that can reduce the on-voltage of the diode. The other InAlGaN films 4a, 4b have no electrons travelling, and do not function as channel, and therefore, they are hereinafter simply referred to as barrier films 4a, 4b. The term "alloy scattering" means that crystals constituting the film have the disturbance (variation) of the composition, and that travelling (moving) of the electrons inside the film having the alloy scattering is disturbed as compared with the film having no alloy scattering inside.

The GaN film 3a and the barrier film 4a contained in the stack structure 6 constitute a heterojunction unit 5a, and the GaN film 3b and the barrier film 4b constitute a heterojunction unit 5b. Here, the composition of an InAlGaN mixed crystal that constitutes the barrier films 4a, 4b is selected so as to have a bigger forbidden band width than that of GaN, and, in one heterojunction unit, the barrier film having a large forbidden band width is arranged to the upper layer of the GaN layer.

Thus, inside such the stack structure 6, the pseudo lattice-matched semiconductor films are joined each other even when they are different in forbidden band width. Here, the stack structure in which the GaN film and the AlGaN film are alternately stacked is taken as an example to give an explanation. When GaN and AlGaN are stacked in a c-axis direction, that is, a direction vertical to a main surface of the substrate 1, a lattice constant of GaN in the stacked surface is 0.3189 nm, whereas a lattice constant of AlN is 0.3114 nm, and the lattice constants of GaN and AlN are approximated to each other. Further, the lattice constant of AlGaN is a value corresponding to a composition ratio between the lattice constant of AlN and the lattice constant of GaN, and takes a value approximate to the lattice constant of GaN. Hence, it is possible to grow (or deposit) the GaN film and the AlGaN film as a continuous crystal.

In such a stack structure in which the GaN film and the AlGaN film are stacked, an electron layer (channel) is generated in the vicinity of the interface of the GaN film side due to the difference in forbidden band width between these films. This electron layer is referred to also as a two-dimensional electron gas. For example, in the case of an AlGaN/GaN hetero structure, since the electron layer (electron gas) having a high concentration of about $10^{13}$ ($cm^{-2}$) in electron density can be obtained, the on-resistance can be reduced. The stacking of a plurality of heterojunction units 5a, 5b can further reduce the on-resistance. When a current flows inside the stack structure 6, in the case of the film such as the GaN film 3b having its upper surface and lower surface contacting with the barrier film, the current mainly flows through the electron layer formed in the vicinity of the upper surface of the GaN film 3b, and hardly flows in the lower surface of the GaN film 3b.

As described above, the GaN film 3a that is a part of the bottom of the stack structure 6 is integrated with the GaN film 3 of the lower part of the stack structure 6 and the GaN film 3 and the GaN film 3a constitute one layer. In other words, while the GaN film 3 extends along the main surface of the substrate 1, a part of the upper part thereof is annularly patterned, and, in the present application, this annular pattern is called a GaN film 3a. On the stack structure 6, the GaN film 6a annularly patterned and the insulating film 11 are formed similarly to the stack structure 6. In other words, the GaN film 6a is formed on the barrier film 4b, and the insulating film 11 is formed on the GaN film 6a. The GaN film 6a is an undoped layer in which p-type or n-type impurities are hardly introduced. Further, the sidewall of the center side of the annular pattern that is the sidewall of the stack structure 6 is defined as a first sidewall 7, and the sidewall of the outside of the annular pattern that is the other sidewall of the stack structure 6 is defined as a second sidewall 9. The first sidewall 7 facing the inner side of the annular pattern is formed as being contacting with a first electrode 8, and the second sidewall 9 opposite to the first sidewall 7 is arranged to contact with the second electrode 10. The first electrode 8 and the second electrode 10 also contact the respective sidewalls of the GaN film 6a and the insulating film 11, and also contact the upper surface of the insulating film 11, respectively. In this way, the first electrode 8 and the second electrode 10 are formed to ride over the upper part of the insulating film 11. However, the first electrode 8 and the second electrode 10 are not adjacent to each other, but electrically insulated.

The first electrode 8 is continuously formed across the upper part of the stack structure 6, the first sidewall 7 of the stack structure 6, and the upper surface of the GaN film 3 inside the annular pattern of the stack structure 6. Similarly, the second electrode 10 is continuously formed across the upper part of the stack structure 6, the second sidewall 9 of the stack structure 6, and the upper surface of the GaN film 3 outside of the annular pattern of the stack structure 6. The first electrode 8 is formed so as to completely cover the upper surface of the GaN film 3 inside the annular pattern of the stack structure 6. As the main features of the semiconductor device according to the present embodiment, an oxide film 12 that is an insulating film formed by oxidizing the semiconductor constituting the barrier films 4a, 4b is present between the barrier films 4a, 4b constituting the stack structure 6 and the first electrode 8, respectively. In other words, the oxide film 12 is interposed between the barrier films 4a, 4b and the first electrode 8, so that the barrier films 4a, 4b are not directly contacting the first electrode 8.

The oxide film 12 is a film resulting from oxidation of the barrier films 4a, 4b composed of AlGaN. The oxide film 12 may be formed of, for example, silicon oxide, but since it is difficult to form other films such as the silicon oxide film on the sidewalls alone of the barrier films 4a, 4b, here, the selective oxidation of the exposed barrier films 4a, 4b can easily provide the oxide film 12.

The respective thicknesses of the GaN films 3a, 3b, and the barrier films 4a, 4b in the direction vertical to the main surface of the substrate 1 are about 25 nm, and the respective thicknesses of the heterojunction units 5a, 5b in the same direction are about 50 nm. The thickness of the GaN film 6a on the stack structure 6 in the same direction is about 2 to 3 nm.

Further, the thickness of the oxide film 12 in the direction along the main surface of the substrate 1 and in the direction to pass through the center of the annular stack structure 6, that is, in the direction vertical to the sidewall of the stack structure 6 is about 1 nm.

Although the illustration is omitted in FIGS. 1 and 2, an interlayer dielectric film is formed on the substrate 1 so as to cover the GaN film 3, the stack structure 6, the insulating film 11, the first electrode 8, and the second electrode 10. Contact plugs for supplying a specific potential to the first electrode 8 and the second electrode 10 are formed on the first electrode 8 and the second electrode 10 by penetrating through the interlayer dielectric film, respectively.

As described above, the first electrode 8 is a Schottky electrode to generate a Schottky barrier wall by contacting with the semiconductor film that constitutes the stack structure 6. The second electrode 10 is an ohmic electrode that contacts the semiconductor film constituting the stack structure 6 and has relatively linear characteristics (ohmic characteristics) in voltage-current characteristics. As the member of the first electrode (Schottky electrode) 8, for example, a laminated electrode of Ni/Au by subsequently stacking Ni (nickel) and Au (gold), a laminated electrode of Pt/Au or a laminated electrode of Pd/Au and the like are used. Further, as the member of the second electrode (ohmic electrode) 10, for example, a laminated electrode of Ti/Al or the like is used.

The stack structure 6, the first electrode 8, and the second electrode 10 constitute a Schottky barrier diode. When a forward bias voltage is applied to the Schottky barrier diode, electrons move from the second sidewall 9 to the first sidewall 7 inside the respective GaN films 3a, 3b and inside the electron layer formed in the vicinity of the interface in which the upper surfaces of the GaN films 3a, 3b and the barrier film contact with each other. That is, the Schottky barrier diode according to the present embodiment is a semiconductor device having a rectification to prevent the current from flowing from the first electrode 8 to the second electrode 10 in forward bias, and to prevent the current from flowing from the second electrode 10 to the first electrode 8 in reverse bias. The Schottky barrier diode utilizes a state that electrons are hardly movable from the first electrode 8 to the GaN films 3a, 3b as a consequence of the Schottky barrier generated by a Schottky junction between the first electrode 8 and the GaN films 3a, 3b.

As shown in FIG. 1, the stack structure 6 and the insulating film 11 on the stack structure 6 are formed in an annular region on the substrate 1 (not shown), and the first electrode 8 is formed inside the annular region, and the second electrode 10 is formed in another annular region surrounding the annular region. However, the layouts of the first electrode 8 and the second electrode 10 may be exchanged. In this case, the oxide film 12 shown in FIG. 2 is formed not in the first sidewall 7 that is the side surface of the inner side of the annular region of the stack structure 6, but formed on the sidewalls of the barrier films 4a, 4b of the second sidewall 9 side that is the side surface of the outside of the annular region of the stack structure 6. The shapes of the stack structure 6, the GaN film 6a thereon, and the insulating film 11 in plan view are not limited to being circular, but may be polygonal such as square or hexagonal. It is not limited to annular, and for example, may be rectangular extending in one direction.

Figure 16:
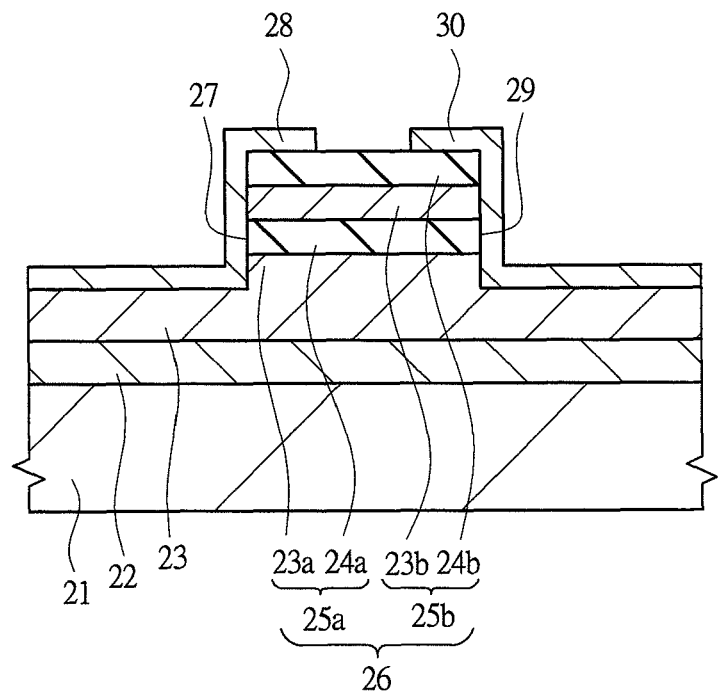
FIG. 16 is a cross-sectional view of a Schottky barrier diode shown as a comparison example.

Next, the effect of the semiconductor device according to the present embodiment will be described using a comparison example. FIG. 16 is a cross-sectional view of a Schottky barrier diode that is a semiconductor device of the comparison example. The semiconductor device shown in FIG. 16 has the substantially same structure as that of the semiconductor device according to the present embodiment described by using FIGS. 1 and 2. That is, a buffer layer 22 and a GaN film 23 are formed in this order on a substrate 21, and a stack structure 26 substantially consisting of a GaN film 23a, a barrier film 24a, a GaN film 23b, and a barrier film 24b stacked in order from the substrate 21 side is formed on the GaN film 23. The barrier films 24a, 24b are composed of an InAlGaN film. The first sidewall 27 that is the other side surface of the stack structure 6 is formed with a first electrode 28 that is a Schottky electrode, and a second sidewall 29 that is another side surface of the stack structure 6 is formed with a second electrode 30 that is an ohmic electrode. The GaN film 23a and the barrier film 24a constitute a heterojunction unit 25a, and the GaN film 23b and the barrier film 24b constitute a heterojunction unit 25b. The heterojunction unit 25a and the heterojunction unit 25b constitute the stack structure 26.

However, being different from the semiconductor device according to the present embodiment, the oxide film 12 (see FIG. 2) is not formed between the first electrode 28 that is the Schottky electrode shown in FIG. 16 and the barrier films 24a, 24b. Also, the GaN film 6a (see FIG. 2) and the insulating film 11 (see FIG. 2) are not formed on the barrier film 24b that constitutes the stack structure 26. In this manner, when the oxide film 12 is not provided, but when the first electrode 28 is made to directly contact the barrier films 24a, 24b that are exposed at the first sidewall 27 of the stack structure 26, crystal defects remain in the side surfaces of the barrier films 24a, 24b that are exposed to dry-etching upon forming the stack structure 6. As a result, a reverse leakage current is apt to flow between the first electrode 28 and the second electrode 30 through the crystal defects, and a problem arises in that the breakdown voltage upon reverse bias of the Schottky barrier diode defined by 1 mA/cm$^2$ is reduced to be low as 100±10 V.

In other words, in the semiconductor device of the comparison example where the barrier films 24a, 24b and the first electrode 28 directly contact with each other, the current flows between the GaN films 23a, 23b and the first electrode 28 not through the Schottky junction between the GaN films 23a, 23b and the first electrode 28, but through the region suffered from the damages of the sidewalls of the barrier films 24a, 24b upon applying reverse bias voltage. Thus, the breakdown voltage in reverse bias of the Schottky barrier diode becomes low.

Note that a reason of generating the reverse leakage current in this way is that the barrier films stacked on the GaN film contact with the electrode in a damaged state, whereas a problem such as the reverse leakage current being generated is avoided in the structure where the electrode is only Schottky-joined to the single GaN film. That is, the invention of the present application is applied to the semiconductor device, which connects a metal electrode to the sidewall of the heterojunction unit by stacking and joining the semiconductor film composed of, for example, GaN and the barrier film composed of, for example, AlGaN.

As a method for preventing the lowering of a reverse breakdown voltage of the semiconductor device in this way, the concentrations of Al inside the barrier films 24a, 24b are considered to be made lower. Since the higher concentrations of Al inside the barrier films 24a, 24b are, the easier leakage current flows, the reverse leakage current can be reduced by suppressing the concentrations of Al. However, when the barrier films 24a, 24b whose concentrations of Al are at low levels are formed, a problem arises in that the electron densities of the electron layers formed inside the GaN films 23a, 23b are reduced to about $10^{12}$ (cm$^{-2}$) and the on-resistance of the Schottky barrier diode is increased.

Figure 17:
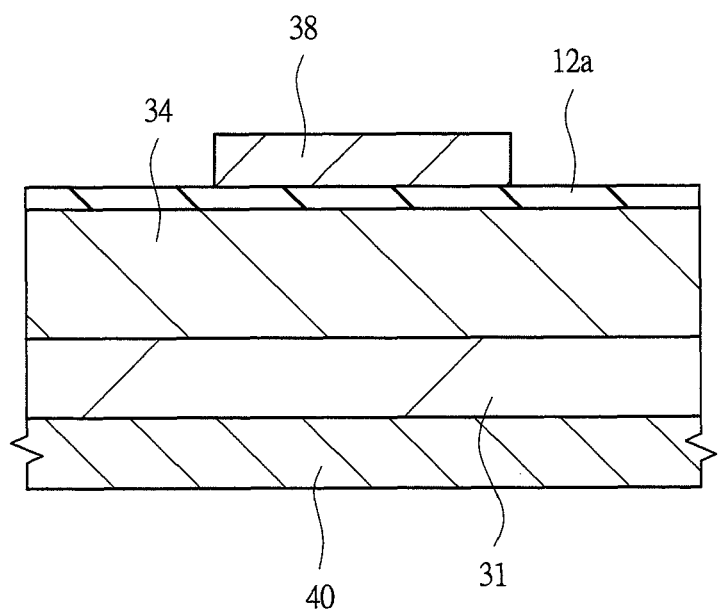
FIG. 17 is a cross-sectional view of a vertical type diode shown as a comparison example.

Hence, the present inventors have conducted a preliminary experiment by using a semiconductor device having a vertical Schottky barrier diode (hereinafter, referred to as vertical diode) as shown in FIG. 17.

FIG. 17 is a cross-sectional view of a semiconductor device of the comparison example to explain the effect of the semiconductor device according to the present embodiment. As shown in FIG. 17, the semiconductor device of the comparison example has an n$^+$-type GaN substrate 31 having an n$^+$-type conductive type, and has a barrier conductor film 34 on an n$^+$-type GaN substrate 31, the composition of the barrier conductor film 34 being graded from an n$^-$-type GaN to an undoped Al$_{0.08}$Ga$_{0.92}$N from the lower surface to the upper surface. In other words, the composition in the vicinity of the upper surface of the barrier conductor film 34 is composed of Al$_{0.08}$Ga$_{0.92}$N, whereas the composition in the vicinity of the lower surface is composed of n$^-$-type GaN. The barrier conductor film 34 has a concentration distribution such that the concentrations of Al vary to higher levels from the lower surface to the upper surface. A Schottky (anode) electrode 38 containing Pt (platinum) is formed on the barrier conductor film 34, and an ohmic (cathode) electrode 40 that is a stack film of Ti and Al films is formed on the lower surface of the n$^+$-type GaN substrate 31. The Schottky electrode 38, for example, has a circular shape in plan view, and its width that is a length (diameter) of the Schottky electrode 38 in the direction along the main surface of the n$^+$-type GaN substrate 31 is 500 μm. Further, the thickness in the c-axis c direction of the region mainly containing undoped Al$_{0.08}$Ga$_{0.92}$N inside the barrier conductor film 34 is about 50 nm. Although the undoped Al$_{0.08}$Ga$_{0.92}$N is a member having a high resistance value, since its thickness is small, a current flows between the Schottky electrode 38 and the ohmic electrode 40 due to tunneling effect.

When such a vertical type diode is formed, before forming the Schottky electrode 38 on the barrier conductor film 34, the Schottky electrode 38 and the ohmic electrode 40 were formed after an UV/O$_3$ (Ultraviolet/Ozone) treatment was conducted at 200° C. for two hours. Thereby, the vertical type diode was formed. As a result, the current-voltage characteristics in the forward direction of the completed vertical type diode were shifted to a high voltage side by 20 mV as compared to the vertical type diode formed without being subjected to the UV/O$_3$ treatment. The current-voltage characteristic in the forward direction of the vertical type diode in this situation is shown in FIG. 18.

Figure 18:
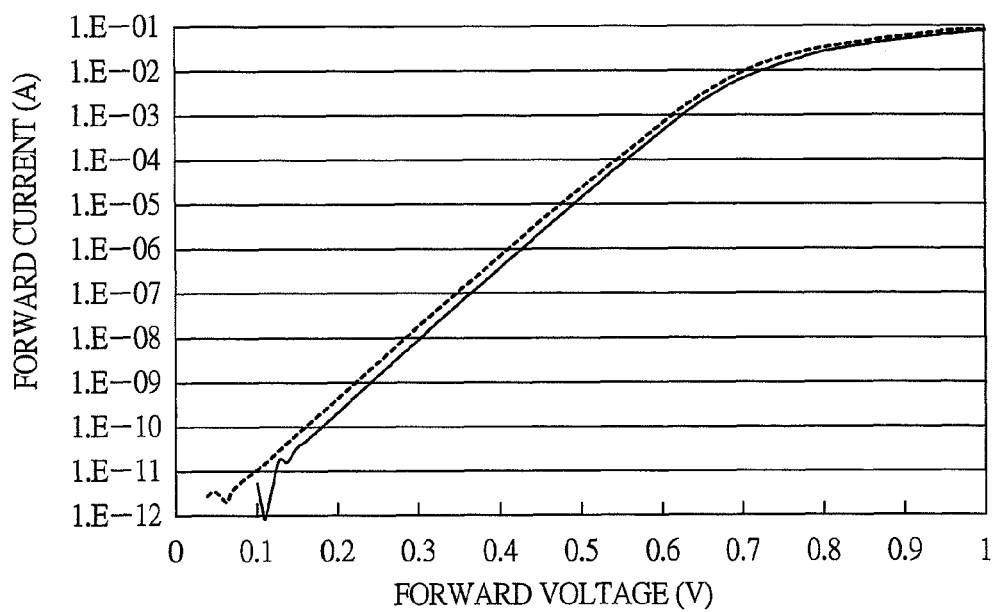
FIG. 18 is a graph showing characteristics of the vertical type diode shown as a comparison example.

FIG. 18 is a graph showing respective current-voltage characteristics for the vertical type diode irradiating the barrier conductor film 34 (see FIG. 17) with ultraviolet and the vertical type diode not irradiating the barrier conductor film 34 with ultraviolet. The vertical axis shows a forward current (A) and the horizontal axis shows a forward voltage (V). The graph shown by a broken line of FIG. 18 shows a current-voltage characteristic of the vertical type diode in which the barrier conductor film 34 is not irradiated with ultraviolet, and the graph shown by a solid line shows a current-voltage characteristic of the vertical type diode in which the barrier conductor film 34 is irradiated with ultraviolet. As shown in FIG. 18, the vertical type diode formed with conducting the UV/O$_3$ treatment is slightly increased in the value of the forward voltage in comparison with the vertical type diode formed without conducting the UV/O$_3$ treatment.

Figure 19:
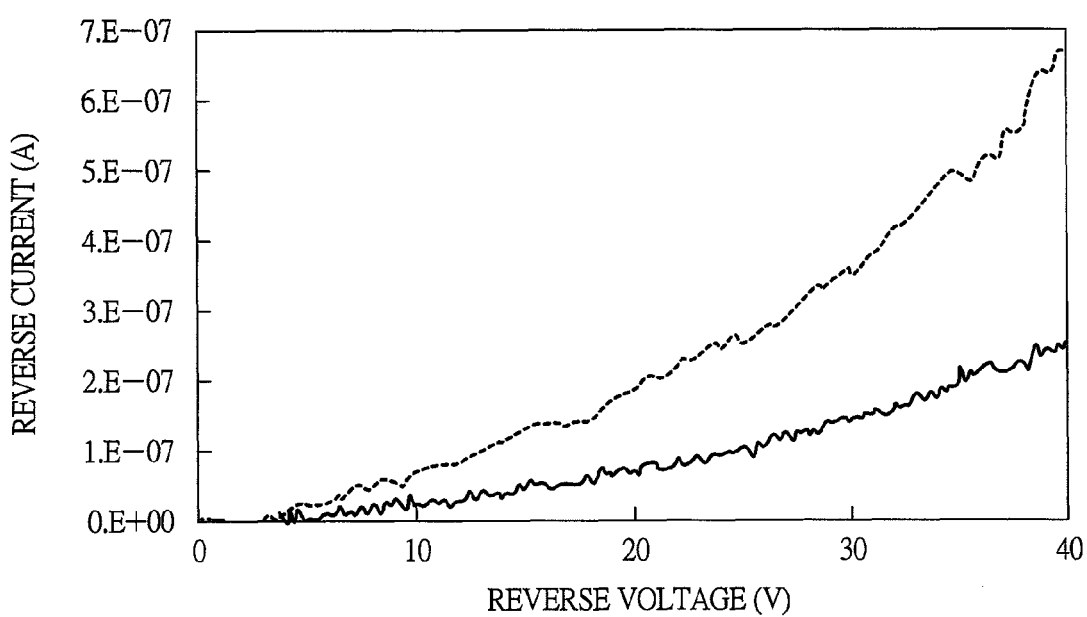
FIG. 19 is a graph showing characteristics of the vertical type diode shown as a comparison example.

The vertical type diode subjected to the UV/O$_3$ treatment, as shown in FIG. 17, is presumed to be formed with an oxide film 12a of about 0.1 nm in thickness on the upper surface of the barrier conductor film 34 through the irradiation of ultraviolet. In other words, the oxide film 12a in this state is interposed between the Schottky electrode 38 and the barrier conductor film 34. Upon measuring respective reverse leakage currents for the vertical type diode having the oxide film 12a and the vertical type diode not having the oxide film 12a as described above, the present inventors have confirmed that, as shown in FIG. 19, the reverse leakage current of the vertical type diode having the oxide film 12a was reduced by half as compared with that of the vertical type diode having not the oxide film 12a. FIG. 19 shows the current-voltage characteristic for the vertical diode having the oxide film 12a and the vertical diode not having the oxide film 12a. The vertical axis of FIG. 19 shows the reverse current (A) of the vertical type diode and the horizontal axis shows the reverse voltage (V) of the vertical type diode. The graph shown by a broken line shows the characteristics of the reverse leakage current of the vertical type diode not having the oxide film 12a, and the graph shown by a solid line shows the characteristics of the reverse leakage current of the vertical type diode having the oxide film 12a. As shown in FIG. 19, it is found that the reverse leakage current of the vertical type diode having the oxide film 12a is reduced by about half the reverse leakage current of the vertical type diode not having the oxide film 12a.

Here, when an oxidation time of the upper surface of the barrier conductor film 34 by the UV/O$_3$ treatment is prolonged, the reverse leakage current can be exponentially reduced. However, the forward voltage shown in FIG. 18 is rapidly increased as the oxide film becomes thicker. If the thickness of the oxide film is 1 nm, the increase of the forward voltage for the vertical type diode formed without performing the UV/O$_3$ treatment is about 150 mV and can be suppressed to a virtually negligible degree. Thus, the optimal range of the thickness of the oxide film 12a can be said to be 0.1 to 1 nm.

In the preliminary experiment described with reference to FIGS. 17 to 19, although the vertical type diode is used, since ozone and oxygen at the time of the UV/O$_3$ treatment are isotropically supplied to the object, even in the horizontal type diode in which an electrically-conducting path of the Schottky barrier diode is formed in the direction parallel to the main surface of the substrate, the forming of the oxide film between the Schottky electrode and the barrier film can bring the same effect. In the vertical type diode, since the current flows through a film having a high resistance value such as the barrier conductor film 34 and the oxide film 12a, the on-resistance of the vertical type diode is increased. Meanwhile, in the horizontal type diode as shown in FIG. 2, since the current flows through the GaN films 3a, 3b, the resistance value between the electrodes can be reduced as compared with the vertical type diode. Further, in the case of using the horizontal type diode, since the number of electron layers (channels) can be increased (made to be multichannel) just by increasing the number of stacking of the heterojunction unit, the on-resistance of the diode can be easily reduced.

Consequently, the result of the preliminary experiment is applied to the semiconductor device according to the present embodiment, and, as shown in FIG. 2, the oxide film 12 having a thickness of about 1 nm in the direction along the main surface of the substrate 1 is provided between the barrier films 4a, 4b constituting the stack structure 6 and the first electrode 8. In this manner, when a high voltage is applied to the second electrode 10, that is, when a reverse-bias voltage is applied, the movement of electrons between the barrier films 4a, 4b and the first electrode 8 can be suppressed. Therefore, the generation of the leakage current (hereinafter, referred to as "reverse leakage current") can be suppressed upon reverse bias as compared with the case where the oxide film 12 is not formed like the semiconductor device of the comparison example shown in FIG. 16. This is because the first electrode 8 and the barrier films 4a, 4b are made not to directly contact each other through the formation of the oxide film 12, and the reverse leakage current is prevented from flowing due to crystal defects of the ends of the barrier films 4a, 4b damaged by dry etching upon patterning the stack structure 6 become the electrically-conducting paths.

As a consequence, the semiconductor device according to the present embodiment eliminates the need for reducing the concentrations of Al inside the barrier films 24a, 24b for the purpose of preventing generation of the reverse leakage current. In the semiconductor device according to the present embodiment, the electron density of the electron layer formed inside the GaN films 3a, 3b becomes $10^{13}$ (cm$^{-2}$), and the electron layer having a high electron density can be formed as compared with the semiconductor device of the comparison example described with reference to FIG. 16, and therefore, it is possible to reduce the on-resistance of the semiconductor device.

Further, similarly to the comparison example as shown in FIG. 16, when the first electrode 28 and the second electrode 30 are formed in a direct contact with the upper surface of the barrier film 24b composed of the InAlGaN film, an electric field is concentrated in the interface among the first electrode 28, the second electrode 30, and the barrier film 24b. This raises a problem in that the reverse leakage current easily flows between the first electrode 28 and the second electrode 30 through the upper surface of the barrier film 24b. In contrast to this, in the semiconductor device according to the present embodiment, the first electrode 8 and the second electrode 10 are prevented from being in a direct contact with the upper surface of the barrier film 4b by forming the GaN film 6a and the insulating film 11 on the stack structure 6, so that the reverse leakage current is prevented from flowing between the first electrode 8 and the second electrode 10. However, only either one of the GaN film 6 and the insulating film 11 may be formed on the barrier film 4b.

When only the insulating film 11 is formed on the barrier film 4b without forming the GaN film 6a, since there is also the possibility that the reverse leakage current flows between the first electrode 8 and the second electrode 10 through the insulating film 11, the insulating film 11 under the region between the first electrode 8 and the second electrode 10 facing each other on the barrier film 4b is preferably eliminated. In other words, the insulating film 11 is formed on the upper surface of the barrier film 4b and between the first electrode 8 and the second electrode 10, respectively, whereas the insulating film 11 is divided into two on the barrier film 4b, and the other interlayer dielectric film is embedded between the patterns of the two insulating films 11 formed on the barrier film 4b.

Further, it is considered that the Schottky barrier diode may form a Schottky electrode on the main surface of the semiconductor substrate having an n-type conductive type through the barrier film composed of undoped AlGaN or the like, and also may form the Schottky electrode as the vertical type diode that forms the ohmic electrode on the rear surface opposite to the main surface of the semiconductor substrate. However, in this structure, when the current flows in the direction vertical to the main surface of the semiconductor substrate, since the current flows through the barrier film having a high resistance value, a problem arises in that the on-resistance of the Schottky barrier diode is increased. In contrast to this, in the semiconductor device according to the present embodiment, since the first electrode 8 and the second electrode 10 are brought into contact with the sidewalls of the stack structure 6, the current can be let flow without involving a barrier film upon forward bias, and a low resistance junction can be realized.

When the pattern of the stack structure 6 is formed not in an annular shape, but in a rectangular shape extending in one direction along the main surface of the substrate 1, a special structure for mitigating an electric field is necessary to be provided in order to prevent the field concentration from occurring in the end of the pattern. In contrast to this, the end of the pattern is prevented from being formed by making the pattern of the stack structure 6 annular as shown in FIGS. 1 and 2, and thus the electric field concentration can be prevented from occurring in a part of the pattern. This makes the structure of the Schottky barrier diode simple and can simplify the fabrication process.

Since the Schottky barrier diode is a semiconductor element that functions as a diode by bringing the first electrode 8 that is the Schottky electrode shown in FIG. 2 into contact with the heterojunction units 5a, 5b, there is no problem when the second electrode 10 contacts the barrier films 4a, 4b damaged in the second sidewall 9. When the oxide film is formed between the second electrode 10 and the barrier films 4a, 4b in the second sidewall 9, there is a possibility that the on-resistance is increased. Hence, even if the oxide film 12 is provided at the first sidewall 7 side, it is desirable that an oxide film is not formed on the second sidewall 9 side. Hence, in the semiconductor device according to the present embodiment, although an oxide film is not provided between the second electrode 10 and the barrier films 4a, 4b, when the increase of the on-resistance does not cause a problem, an oxide film may be formed between the second electrode 10 and the barrier films 4a, 4b in the second sidewall 9 similarly to the oxide film 12.

Next, the fabrication method of the semiconductor device according to the present embodiment will be described with reference to FIGS. 3 to 8, and at the same time, the configuration of the semiconductor device will be more clarified. FIGS. 3 to 8 are cross-sectional views Showing the fabricating process of the semiconductor device according to the present embodiment, and show a cross-sectional view at the same position as that of the cross-sectional view of FIG. 2.

Figure 3:
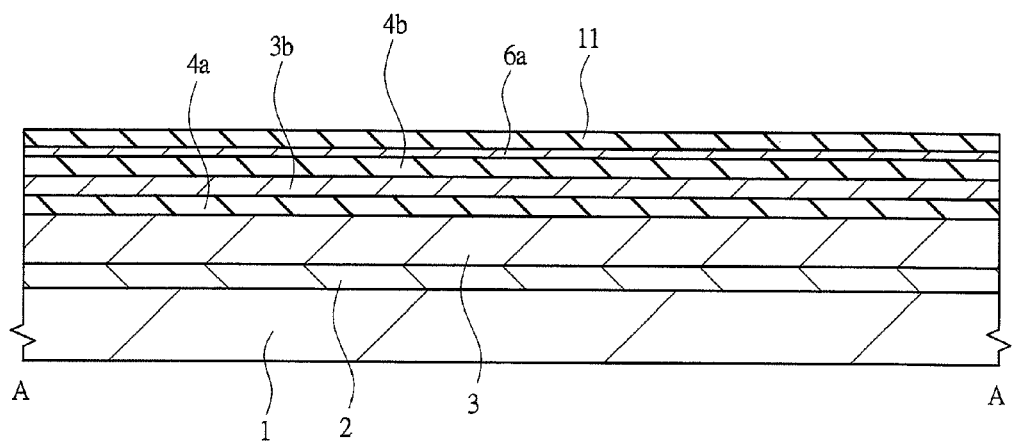
FIG. 3 is a cross-sectional view showing a fabrication method of the Schottky barrier diode that is the first embodiment of the present invention.

First, as shown in FIG. 3, for example, a Si substrate is prepared as the substrate 1, and for example, an AlGaN layer is formed on the substrate 1 as the buffer layer 2 in the thickness of about 2 μm by using a vapor phase epitaxy method. Here, impurity compounds are not introduced into the film-forming apparatus, and the buffer layer 2 is used as an undoped layer. Subsequently, the GaN film 3 is formed on the buffer layer 2 as a compound semiconductor film in the thickness of about 2 μm by using the vapor phase epitaxy method.

Subsequently, the barrier film 4a composed of an $Al_{0.25}Ga_{0.75}N$ film is formed on the GaN film 3 in the thickness of about 25 nm by using the vapor phase epitaxy method. After that, a GaN film 3b is formed on the barrier film 4a in the thickness of about 25 nm, and then, the barrier film 4b composed of the $Al_{0.25}Ga_{0.75}N$ film is formed on the GaN film 3b in the thickness of about 25 nm. As described above, the GaN film and the $Al_{0.25}Ga_{0.75}N$ film are approximated to each other in lattice constant, and can be formed as a continuous crystal just by adjusting a source gas in the vapor phase epitaxy method. After that, the GaN film 6a that is an undoped layer is formed on the barrier film 4b by using the vapor phase epitaxy method. Then, as the insulating film 11, for example, a silicon oxide film is deposited on the GaN film 6a by a CVD (Chemical Vapor Deposition) method.

Figure 4:
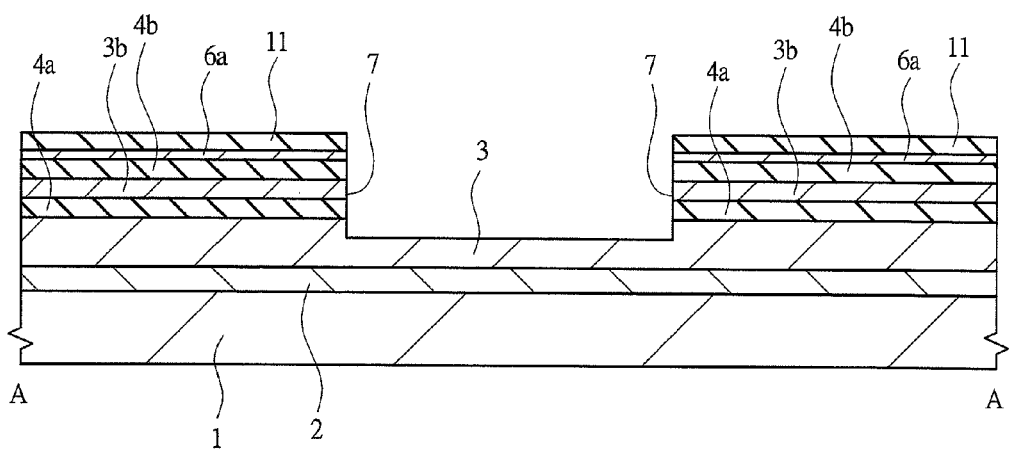
FIG. 4 is a cross-sectional view describing a method of fabricating the Schottky barrier diode continued from FIG. 3.

Next, as shown in FIG. 4, a photoresist film (not shown) is formed on the insulating film 11, and is exposed and developed by using photolithography technology, thereby allowing the photoresist film to remain in a prescribed region. Subsequently, with the remaining photoresist film used as a mask, the insulating film 11 is processed by dry etching so as to form a hole from which the upper surface of the GaN film 6a is exposed, and then, the photoresist film is removed. Hereinafter, such a process is referred to as patterning, where a film having a prescribed shape (for example, a photoresist film) is formed and the other film is etched (selectively removed) with that film used as a mask, and then, a pattern having a desired shape is formed. By this patterning process, the insulating film 11 is formed in a desired region. Here, by removing the insulating film 11 in a circular region in plan view, a through-hole that penetrates the insulating film 11 is formed.

After that, with the remaining insulating film 11 used as a mask, the stack film of the GaN film 6a, the barrier film 4b, the GaN film 3b, the barrier film 4a, and the GaN film 3, all of which are located immediately below the through-hole, is dry-etched down to a prescribed depth from the upper surface of the lowermost GaN film 3, and the first sidewall 7 (see FIG. 2) that is the inner sidewall of the stack structure 6 (see FIG. 2) formed by a subsequent process is formed. In other words, here, the stack film is removed by etching down to the middle of the depth of the GaN film 3, and the buffer layer 2 is not allowed to be exposed. In the dry etching of this process, for example, a dry etching using, for example, chlorine plasma is used. Here, the side surfaces of the barrier films 4a, 4b exposed by the dry etching process is damaged by the dry etching. Thus, insulation properties are considered to be deteriorated because crystal defects are generated as a result.

Figure 5:
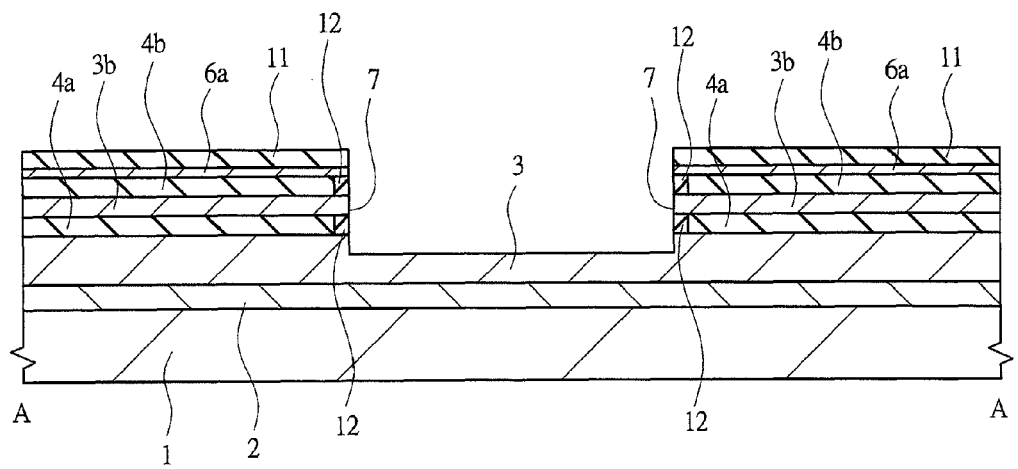
FIG. 5 is a cross-sectional view describing a method of fabricating the Schottky barrier diode continued from FIG. 4.

Next, as shown in FIG. 5, a specimen including the substrate 1 and a structure formed thereon is heated to 200° C., and is radiated with ozone generated by a mercury lamp having a wavelength of 184.9 nm for two hours. Upon this ozone radiation treatment ($UV/O_3$ treatment), the side surfaces of the GaN films 3, 3b and 6a and the upper surface of the GaN film 3 exposed by dry etching are hardly deteriorated, whereas the side surfaces of the exposed barrier films 4a, 4b are oxidized, and the oxide film 12 having a main component of $Al_2O_3$ and the thickness in the direction along the main surface of the substrate 1 of about 1 nm is selectively formed. In other words, the oxide film 12 is an oxide of the barrier films 4a, 4b.

Figure 6:
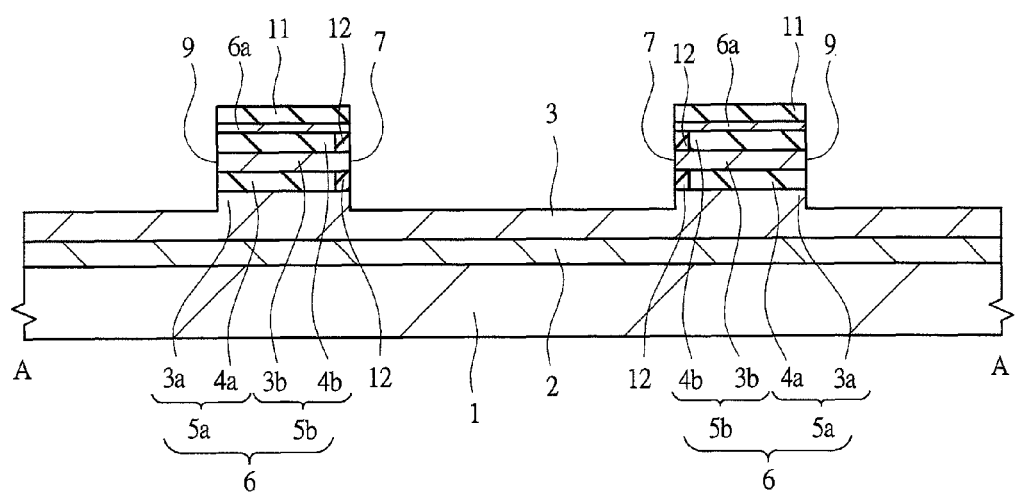
FIG. 6 is a cross-sectional view describing a method of fabricating the Schottky barrier diode continued from FIG. 5.

Next, as shown in FIG. 6, the photoresist film is made to remain in the prescribed region on the insulting film 11 by photolithography technology, and then, with the photoresist film used as a mask, the insulating film 11 is etched, and after that, the photoresist film is removed. Therefore, the insulating film 11 having an annular shape in plan view is formed. Then, with the remaining insulating film 11 used as a mask, the stack film of the GaN film 6a, the barrier film 4b, the GaN film 3b, the barrier film 4a, and the GaN film 3 is dry-etched down to the prescribed depth from the upper surface of the lowermost GaN film 3, and the second sidewall 9 that is the sidewall outside of the stack structure 6 is formed. In other words, here, the stack film is removed by etching down to the middle of the depth of the GaN film 3, and the buffer layer 2 is not allowed to be exposed. Here, for example, a dry etching using chlorine plasma is performed.

By this process, the GaN film 3a is formed, which is the upper region inside the GaN film 3 whose upper part is partially removed and which is a projection having a sidewall of curved surface and composed of the GaN film 3. The GaN film 3 and the GaN film 3a are an integrated layer, and the GaN film 3a is a pattern having an annular shape in plan view. By the process as described above, the stack structure 6 composed of a plurality of annular patterns sequentially stacked on the GaN film 3 is formed. The stack structure 6 is composed of the heterojunction unit 5a and the heterojunction unit 5b on the heterojunction unit 5a. The heterojunction unit 5a is composed of the GaN film 3a and barrier film 4a on the GaN film 3a, and the heterojunction unit 5b is composed of the GaN film 3b and the barrier film 4b on the GaN film 3b. Consequently, the stack structure 6 includes the GaN film 3a, the barrier film 4a, and the GaN film 3b and the barrier film 4b sequentially stacked on the GaN film 3, and has an annular shape in plan view.

Further, the GaN film 6a and the insulating film 11, which are annular patterns, are sequentially stacked on the upper part of the stack structure 6 from the stack structure 6 side. The sidewall of the inner side of the stack structure 6 that is the annular pattern is the first sidewall 7, and the sidewall of the outside that is the other sidewall is the second sidewall 9. Here, the respective sidewalls of the barrier films 4a, 4b of the first sidewall 7 side are formed with the oxide film 12, whereas the respective sidewalls of the barrier films 4a, 4b of the second sidewall 9 side are not formed with the oxide film 12. The side surfaces of the barrier films 4a, 4b are exposed at the second sidewall 9.

Figure 7:
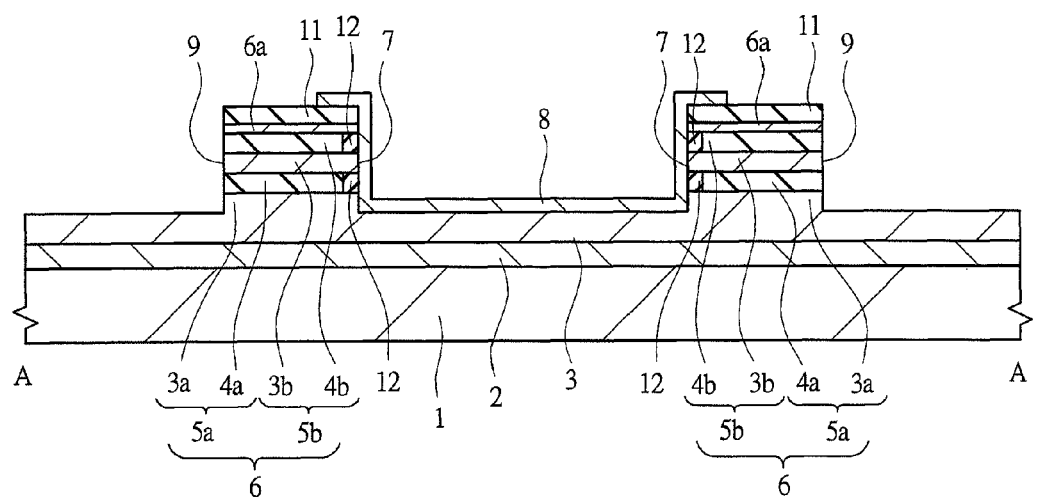
FIG. 7 is a cross-sectional view describing a method of fabricating the Schottky barrier diode continued from FIG. 6.

Next, as shown in FIG. 7, the photoresist film is formed by using photolithography technology so as to cover the periphery part of the upper surface of the insulating film 11, the second sidewall 9, and the upper surface of the GaN film 3 of the region outside the stack structure 6. More specifically, the outer periphery part in the vicinity of the insulating film 11 that is the annular pattern is covered by the photoresist film, whereas the inner periphery part of the insulating film 11, the first sidewall 7 of the inner side of the inner periphery part, and the upper surface of the GaN film 3 are exposed from the photoresist film. Subsequently, a metal film as an electrically conductive film is deposited on the entire surface of the main surface of the substrate 1 as well as on the photoresist film. The metal film, for example, is a stacked film of Ni/Au stacked with Ni and Au in this order from the substrate 1 side, and is formed by using a sputtering method, an EB (Electron Beam) evaporating method or the like.

Subsequently, the stacked film of Ni/Au is made to remain in the desired region only by technique (lift-off process) of removing the photoresist film together with the stacked film of Ni/Au deposited thereon, and the first electrode 8 composed of the stacked film of Ni/Au that contacts the first sidewall 7 of the stack structure 6 and the oxide film 12 is formed. In other words, the first electrode 8 is continuously formed with the upper surface of the GaN film 3 of the inner side of the first annular sidewall 7, the first sidewall 7, the sidewall of the inner side of the GaN film 6a, the sidewall of the inner side of the insulating film 11, and the upper surface of the vicinity of the inner periphery part of the insulating film 11. The first electrode 8 is a Schottky electrode that forms a Schottky junction with the GaN films 3a, 3b at the first sidewall 7. Since the first sidewall 7 is formed with the oxide film 12, the first electrode 8 contacts the oxide film 12 but does not contact the barrier films 4a, 4b. Therefore, the first electrode 8 does not contact the sidewalls of the damaged barrier films 4a, 4b.

Figure 8:
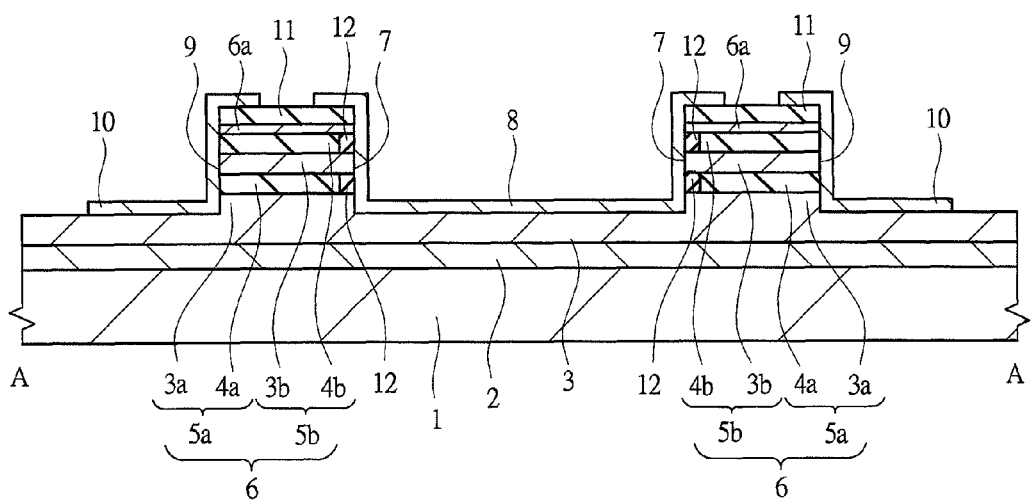
FIG. 8 is a cross-sectional view describing a method of fabricating the Schottky barrier diode continued from FIG. 7.

Next, as shown in FIG. 8, the process similar to the process described with reference to FIG. 7 is performed, and the second electrode 10 (for example, Ti/Au) contacting the second sidewall of the stack structure 6 is formed by using the lift-off method. Here, the second electrode 10 is formed not inside of the stack structure 6 that is the annual pattern, but only on the upper surface of the GaN film 3 of the region outside of the stack structure 6, the second sidewall 9, the sidewall outside of the GaN film 6a, the sidewall of the outside of the insulating film 11, and the upper surface of the outer periphery part of the insulating film 11. In this manner, the second electrode 10 contacts the barrier films 4a, 4b at the second sidewall 9, and is also ohmic-connected to the GaN films 3a, 3b. One end of the upper surface of the insulating film 11 is covered by the first electrode 8, and the other end on the opposite side is covered by the second electrode 10. Since the insulating film 11 is exposed between the first electrode 8 and the second electrode 10, the first electrode 8 and the second electrode 10 do not contact each other, and are electrically isolated. Thus, the Schottky barrier diode having the stack structure 6, the first electrode 8, and the second electrode 10 is formed.

Although the subsequent process is not illustrated, a thick interlayer dielectric film is formed on the substrate 1 so as to cover the stack structure 6, the first electrode 8, and the second electrode 10 by a CVD method or the like, and then, contact plugs that penetrate through the interlayer dielectric film are formed on the first electrode 8 and the second electrode 10. Subsequently, a plurality of metal wirings are formed on the contact plugs, and the plurality of metal wirings, the first electrode 8, and the second electrode 10 are electrically connected through the contact plugs, respectively, thereby completing the semiconductor device according to the present embodiment.

In the above-described fabrication process, the semiconductor device is formed in the order of the following processes: "the formation of the first sidewall, the oxidation of the barrier films, the formation of the second sidewall, the formation of the first electrode, and the formation of the second electrode". However, this process order can be changed to either "the formation of the first sidewall, the oxidation of the barrier films, the formation of the first electrode, the formation of the second sidewall, and the formation of the second electrode" or "the formation of the second sidewall, the formation of the second electrode, the formation of the first sidewall, the oxidation of the barrier films, and the formation of the first electrode".

In the above-described fabrication process, although the insulating film 11 is formed on the upper side of the stack structure 6, if the GaN film 6a is formed on the stack structure 6, the insulating film 11 may not be formed. In this case, the patterning of the GaN film 6a and the stack structure 6 does not use the insulating film 11 as a mask but uses the photoresist film as a mask. Alternatively, with using the insulating film 11 as a mask, the patterning of the GaN film 6a and the stack structure 6 is performed, and then, the insulating film 11 is removed.

As described above, when the first electrode 8 and the second electrode 10 directly contact the upper surface of the barrier film 4b of the upper side of the stack structure 6, this becomes a cause of generating the reverse leakage current. Therefore, in view of preventing generation of the reverse leakage current, it is desirable to form the insulating film 11 on the stack structure 6, if the GaN film 6a is not formed. When the GaN film 6a is not formed, the insulating film 11 is formed directly on the upper surface of the barrier film 4b. This leads to the possibility of making the reverse leakage current to flow between the first electrode 8 and the second electrode 10 through the insulating film 11.

The generation of such a reverse leakage current is caused by incompatibility between the insulating film 11 and the AlGaN film. Consequently, similarly to the semiconductor device shown in FIG. 2, when the insulating film 11 is formed on the AlGaN film via the GaN film 6a, there is no problem even if the insulating film 11 is continuously formed between the first electrode 8 and the second electrode 10. The insulating film 11 shown in FIG. 2 is a film simply provided for the purpose of being used as a patterning mask of the stack structure 6, and is not provided for the purpose of preventing the first electrode 8 and the second electrode 10 from directly contacting the barrier film 4b. In the semiconductor device shown in FIG. 2, it is the GaN film 6a that prevents the first electrode 8 and the second electrode 10 from directly contacting the barrier film 4b.

Figure 9:
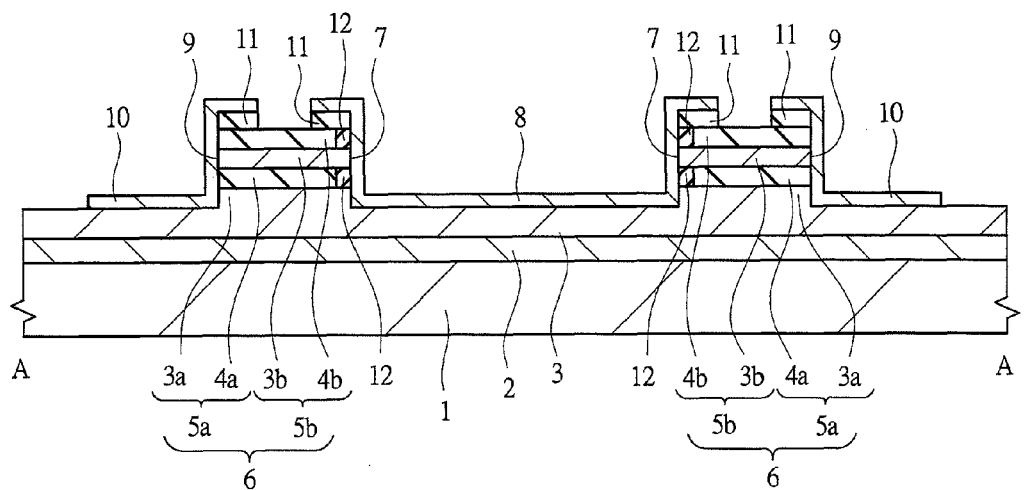
FIG. 9 is a cross-sectional view showing a first modification example of the Schottky barrier diode that is the first embodiment of the present invention.

In contrast to this, when the GaN film 6a is not formed, it is desirable that the insulating film 11 directly below the region between the first electrode 8 and the second electrode 10 is removed with the insulating film 11 directly below the first electrode 8 and the second electrode 10 left alone in order to prevent the reverse leakage current from flowing through the interface between the insulating film 11 and the barrier film 4b, thereby to expose the upper surface of the barrier film 4b as shown in FIG. 9. In other words, the insulating film 11 directly below the first electrode 8 and the insulating film 11 directly below the second electrode 10 are not formed continuously but divided so that the reverse leakage current can be prevented from flowing through the interface of the insulating film 11 and the barrier film 4b. FIG. 9 shows a cross-sectional view of the same position as that of the cross-sectional view of FIG. 2.

FIG. 9 is a cross-sectional view of the semiconductor device of a first modification example according to the present embodiment having substantially the same structure as that of the semiconductor device shown in FIG. 2. However, being different from the semiconductor device shown in FIG. 2, the GaN film 6a is not formed on the stack structure 6 of the semiconductor device shown in FIG. 9, and the insulating film 11 is not formed immediately below the region between the first electrode 8 and the second electrode 10 on the insulating film 11, and a part of the upper surface of the barrier film 4b is exposed from the insulating film 11.

Meanwhile, even when the GaN film 6a and the insulating firm 11 are not formed, it is considered that the oxide film 12 that is the insulating film is formed at the side surfaces of the barrier films 4a, 4b of the first sidewall 7 by the oxidation process based on the UV/O$_3$ treatment described with reference to FIG. 5, and the oxide film 12 is also formed on the upper surface of the exposed barrier film 4b. In this case, even if the first electrode 8 and the second electrode 10 are formed on the barrier film 4b after performing the process described with reference to FIG. 5, the reverse leakage current can be prevented from flowing through the upper surface of the barrier film 4b because the oxide film 12 is formed between the barrier film 4b and the first electrode 8 and the barrier film 4b and the second electrode 10 as shown in FIG. 10.

Figure 10:
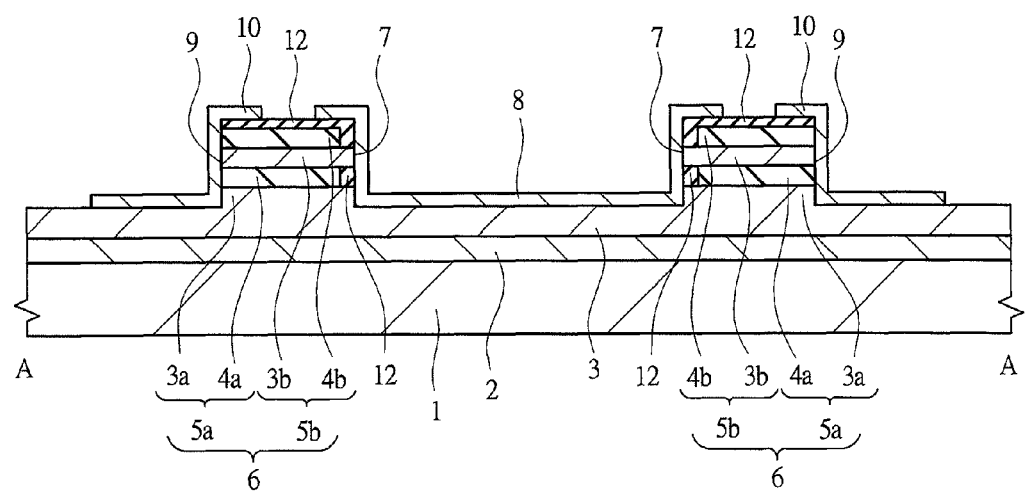
FIG. 10 is a cross-sectional view showing a second modification example of the Schottky barrier diode that is the first embodiment of the present invention.

FIG. 10 is a cross-sectional view of the semiconductor device of a second modification example according to the present embodiment, which has substantially the same structure as that of the semiconductor device shown in FIG. 2 and shows a cross-sectional view of the same position as that of the cross-sectional view of FIG. 2. However, being different from the semiconductor device shown in FIG. 2, the GaN film 6a and the insulating film 11 are not formed on the stack structure 6 of the semiconductor device shown in FIG. 10, and instead, the oxide film 12 covers the upper surface of the barrier film 4b. The thickness of the oxide film 12 of the upper surface of the barrier film 4b is about 1 nm in the direction vertical to the main surface of the substrate 1.

The reason why the GaN film 6a, the insulating film 11 or the oxide film 12 are provided on the upper surface of the stack structure 6 as described above is to prevent the generation of the reverse leakage current caused by the formation of the first electrode 8 and the second electrode 10 by riding over the upper surface of the stack structure 6. Therefore, when the first electrode 8 and the second electrode 10 are not formed on the stack structure 6, but the first electrode 8 and the second electrode 10 are formed at the sidewall of the stack structure 6, there is no need to form the GaN film 6a, the insulating film 11 or the oxide film 12 on the upper surface of the stack structure 6.

As described above, in the semiconductor device of the comparison example described with reference to FIG. 16, there is a problem in that, because the barrier films 24a, 24b directly contact the first electrode 28, the reverse leakage current flows between the first electrode 28 and the GaN films 23a, 23b through the sidewalls of the barrier films 24a, 24b that are exposed by dry etching and left with crystal defects. In this case, the breakdown voltage of the diode that is defined to be 1 mA/cm$^2$ becomes 100±10 V.

In contrast to this, according to the investigations conducted by the present inventors, when the reverse breakdown voltage of the Schottky barrier diode in the semiconductor device according to the present embodiment described with reference to FIGS. 3 to 10 was measured, a good result of 800±100V was obtained. This is because the reverse leakage current can be prevented from flowing by providing the oxide film 12 between the first electrode 8 and the barrier films 4a, 4b as shown in FIG. 8 even if the crystal defects due to the dry etching at the side surface of the barrier films 4a, 4b remain.

The composition of the barrier films 4a, 4b may be the AlGaN film having a composition different from the above-described composition, and even if the AlGaN film having a composition different from the above described composition is used, the same effect as described above can be obtained.

While the heterojunction unit is staked in two layers in the structure of the semiconductor device as described above, three or more layers of the heterojunction unit may be stacked. The increase in the number of layers of the heterojunction unit, that is, the number of channels in this way can reduce the on-resistance of the Schottky barrier diode.

Figure 11:
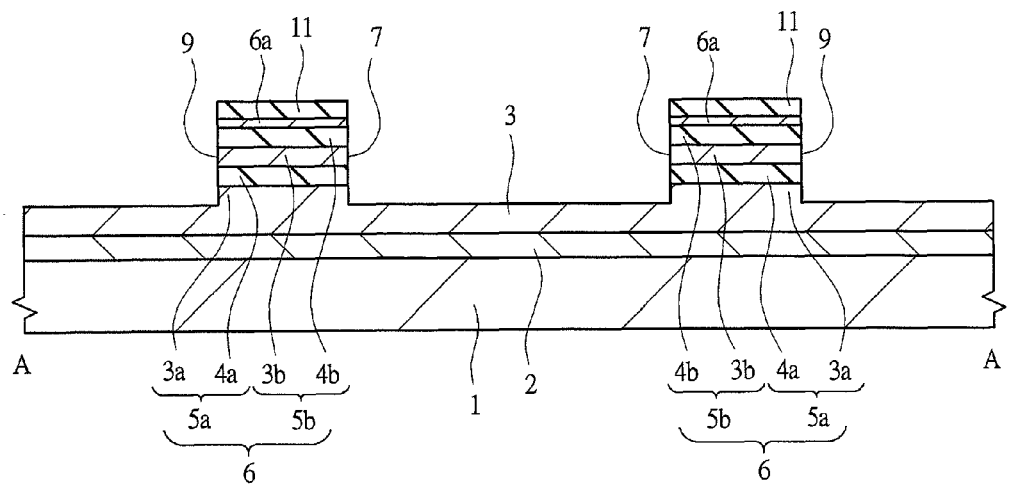
FIG. 11 is a cross-sectional view showing a fabrication method of a third modification example of the Schottky barrier diode that is the first embodiment of the present invention.
Figure 12:
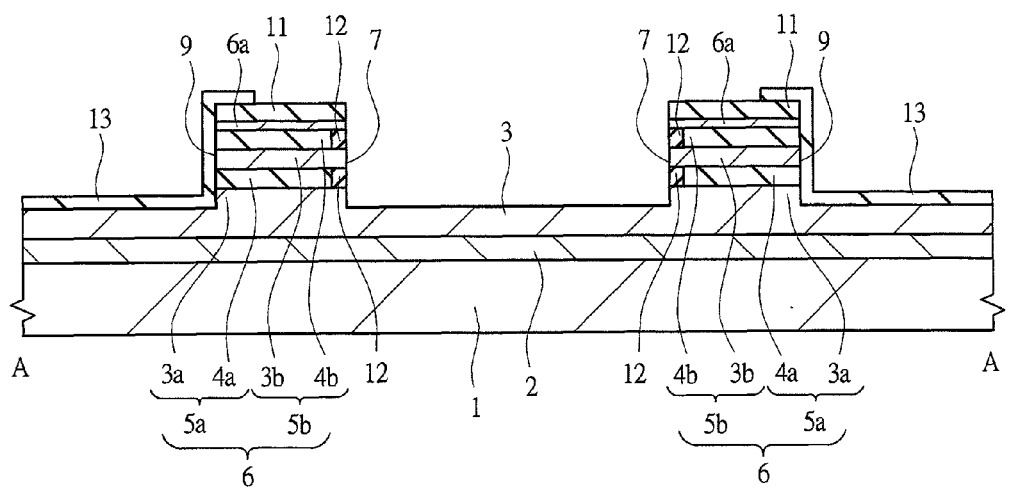
FIG. 12 is a cross-sectional view describing the fabrication method of the Schottky barrier diode continued from FIG. 11.
Figure 13:
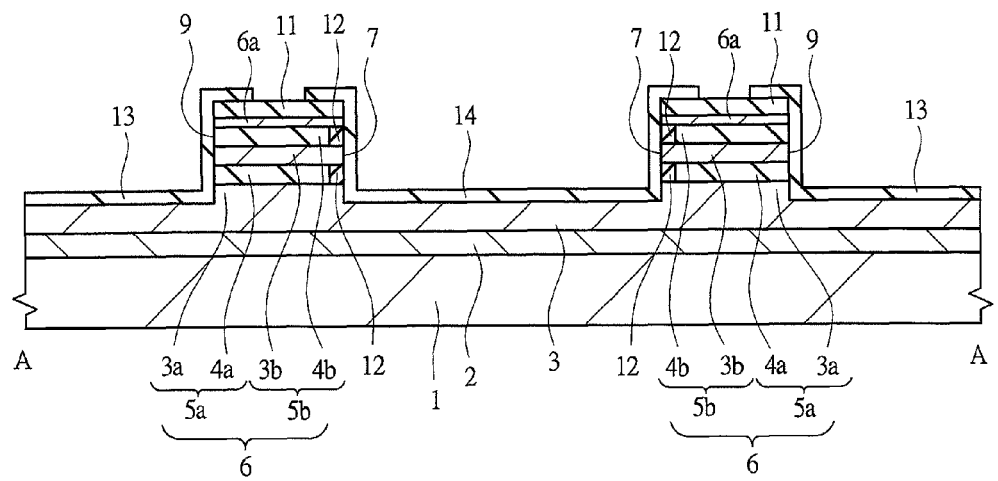
FIG. 13 is a cross-sectional view describing the fabrication method of the Schottky barrier diode continued from FIG. 12.

The above-described fabrication process uses a method for oxidizing the surfaces of the barrier films 4a, 4b exposed at the first sidewall 7 before forming the second sidewall 9 or in a state in which the second sidewall 9 is not exposed so as to prevent the oxide film from being formed between the second electrode 10 that is the ohmic electrode and the barrier films 4a, 4b. As a third modification example, in contrast to this, a fabrication method for forming the stack structure 6 by one etching process will be described below with reference to FIGS. 11 to 13. FIGS. 11 to 13 show cross-sectional views of the same position as that of the cross-sectional view of FIG. 2.

In the fabrication process of the semiconductor device that is the third modification example, first, the stack structure shown in FIG. 3 is formed, and then, as shown in FIG. 11, a pattern of the stack structure 6 is formed by using the photolithography technology and the dry etching method. Here, the structure of the semiconductor device in the midst of the fabrication process is almost the same as the structure shown in FIG. 6 except that the oxide film 12 is not formed, but different from the fabrication method as described above in that the side surfaces of the barrier films 4a, 4b are exposed at the first sidewall 7. In this case, crystal defects are considered to be generated as the side surfaces of the barrier films 4a, 4b of the first sidewall 7 side are damaged by the dry etching.

Next, an insulating film 13 composed of, for example, a silicon oxide film is formed on the entire surface of the main surface of the substrate 1 so as to cover the stack structure 6 by the CVD method and the like, and then, the insulating film 13 is processed by the photolithography technology and the dry etching method. This exposes the first sidewall 7 of the stack structure 6 and the upper surface of the GaN film 3 of the inner side of the first sidewall 7. Subsequently, the oxide film 12 is formed on the side surfaces of the barrier films 4a, 4b, that is, only on the side surfaces 4a, 4b on the first sidewall 7 side by performing the UV/$O_3$ treatment.

Next, although the insulating film 13 is removed, in order to prevent the oxide film 12 from being removed by an etchant (etching solution) such as hydrofluoric acid used here, an insulating film 14 composed of, for example, a silicon nitride film is formed on the entire surface of the main surface of the substrate 1 so as to cover the stack structure 6 and the insulating film 13 by the CVD method and the like, and then, the insulating film 13 is processed by using the photolithography technology and the dry etching method. Therefore, an insulating film 14 that covers the insulating film 12 and exposes the insulating film 13 is formed.

After that, though not illustrated, the insulating film 13 is removed by wet etching using hydrofluoric acid, and then, the insulating film 14 is removed by wet etching using phosphoric acid, so that the same structure as that of FIG. 6 can be obtained. In the succeeding processes, the processes described with reference to FIGS. 7 to 8 are performed, thereby completing the semiconductor device of the third modification example.

In the semiconductor device of the third modification example thus formed, since the sidewalls of both sides of the stack structure 6 are patterned by one etching process, variations in the distance between the first sidewall 7 and the second sidewall 9 due to the misalignment of a photo mask can be prevented from occurring. In other words, the semiconductor device can be formed by maintaining the distance between the anode electrode and the cathode electrode constant, and therefore, variations in breakdown voltage of the semiconductor device can be suppressed.

In the fabrication method described with reference to FIGS. 3 to 8, the stack structure 6 is formed by two times of etching so that an oxide film is not formed between the second electrode 10 and the barrier films 4a, 4b, and oxidation of respective side surfaces of the barrier films 4a, 4b is performed after the first sidewall 7 is formed and before the second sidewall 9 is formed. Further, in the fabrication method described by using FIGS. 11 to 13, the oxidation of respective side surfaces of the barrier films 4a, 4b is performed in a state in which the insulating film 13 is formed for the purpose of not forming the oxide film similarly between the second electrode 10 and the barrier films 4a, 4b.

However, when the increase of the on-resistance due to the formation of the oxide film between the second electrode 10 and the barrier films 4a, 4b is to such an extent of not causing a problem, an oxide film may be formed between the second electrode 10 and the barrier films 4a, 4b in the second sidewall 9 similarly to the oxide film 12. In that case, the fabrication method described with reference to FIGS. 3 to 8 and FIGS. 11 to 13 is not employed, but for example, the structure having the stack structure 6 is formed in a lump by the etching process described with reference to FIG. 11, and then, the respective side surfaces of both sides of the barrier films 4a, 4b are oxidized. After that, the Schottky barrier diode is considered to be formed by the processes of FIGS. 7 and 8.

An application example of the Schottky barrier diode described with reference to FIGS. 1 to 13 will be described below. The semiconductor device according to the present embodiment can be used, for example, for a drive circuit of a three-phase motor used in a hybrid vehicle and so forth.

Figure 14:
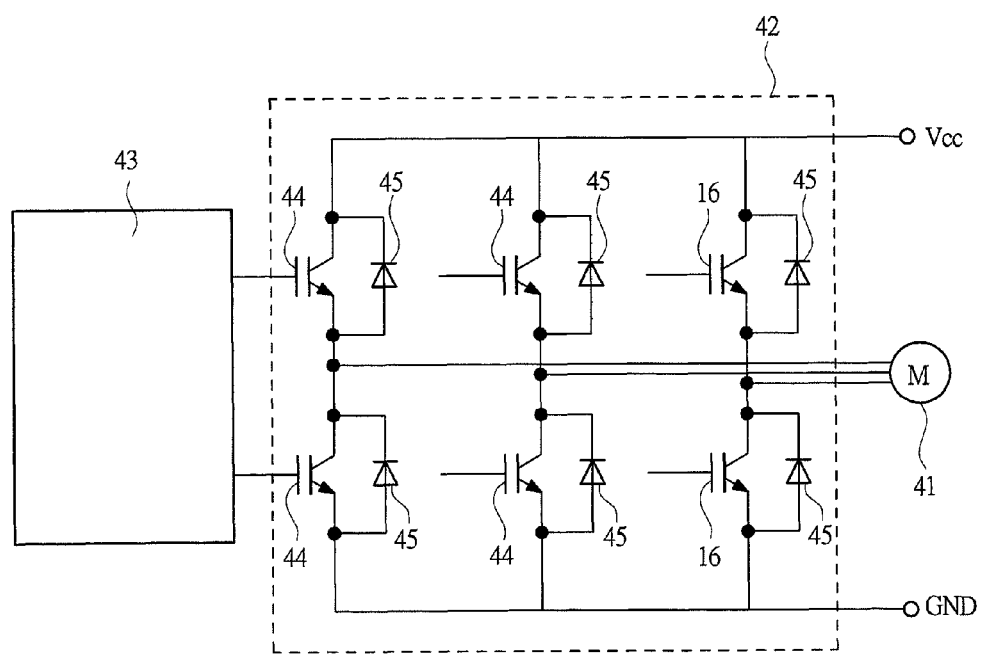
FIG. 14 is a circuit diagram of a three-phase motor showing an application example of the Schottky barrier diode that is the first embodiment of the present invention.

FIG. 14 is a circuit diagram of a three-phase motor using the Schottky barrier diode according to the present embodiment. As shown in FIG. 14, the three phase-motor circuit has a three-phase motor 41, a power semiconductor device 42, and a control circuit 43. The three-phase motor 41 is constituted in such a manner as to be driven by three-phase voltages different in phase. The power semiconductor device 42 being shown surrounded by a broken line in FIG. 14 is constituted by a switching element for controlling the three-phase motor 41, and for example, an IGBT (Insulated Gate Bipolar Transistor) 44 and a diode 45 are provided corresponding to each of the three phases. That is, in each single phase out of the three phases, the IGBT 44 and the diode 45 are connected in reverse-parallel between a power-supply voltage (Vcc) and an input voltage of the three-phase motor. The IGBT 44 and the diode 45 are also connected in reverse-parallel between the input voltage of the three-phase motor and a ground potential (GND). In other words, the three-phase motor 41 is provided with two IGBTs 44 and two diodes 45 at every single phase (each phase), and therefore, six IGBTs 44 and six diodes 45 are provided in three phases.

Gate electrodes of the respective IGBTs 44, although the illustration thereof is partially omitted, are connected to the control circuit 43, respectively, and by this gate control circuit 43, the IGBTs 44 are controlled. In the drive circuit of the three-phase motor having such a power semiconductor device 42 and a control circuit 43, the three-phase motor 41 is rotated by controlling the current flowing through the IGBTs 44 (switching element) constituting the power semiconductor device 42 by the control circuit 43. In other words, the IGBTs 44 function as switching devices for supplying the power supply potential (Vcc) to the three-phase motor 41 or for supplying the ground voltage (GND), and the three-phase motor 41 can be driven by controlling on/off timing of the IGBTs 44 by the control circuit 43.

The IGBT 44 and the diode 45, as shown in FIG. 14, are connected in reverse-parallel to each other, and the function of the diode 45 here will be described below.

When there is a load that is purely resistive and does not contain inductance, no free-wheeling energy is induced, and therefore, the diode 45 is not required. However, when a load is connected with a circuit containing inductance such as a motor (for example, three-phase motor), there is a mode wherein a load current flows in the direction reverse to a turned-on switch (IGBT 44). Here, since a single element of the switching device is not provided with a function capable of allowing this reverse current to flow, a diode is necessary to be connected in reverse-parallel to the switching device such as the IGBT 44. That is, in an inverter circuit, when inductance is contained in the load like in motor control, the energy stored in inductance must be surely discharged in the case that the switching device such as the IGBT 44 is turned off. The single element of the IGBT 44 is unable to flow the reverse current for discharging the energy stored in inductance. Hence, in order to flow back the electrical energy stored in the inductance, the IGBT 44 is connected in reverse-parallel to the diode 45. In other words, the diode 45 has a function of letting flow the reverse current to discharge the electrical energy stored in the inductance.

When the Schottky barrier diode described in the present embodiment is used as such a diode 45, the circuit performance of the three-phase motor can be improved. The three-phase motor circuit is just only one of application examples of the semiconductor device according to the present embodiment, and it is needless to say that the semiconductor device according to the present embodiment can be used in a variety of circuits.

Second Embodiment

While the stacked film of the GaN film and the AlGaN film has been used as a heterojunction unit in the first embodiment, the heterojunction unit stacked with other semiconductor films may also be used. For example, instead of the AlGaN film, an InAlN film may be used. That is, as the heterojunction unit, a stack film of a GaN film and an InAlN film may be used. As described above, the lattice constant of GaN in the stack layer surface which is the interface between the films constituting the heterojunction unit is 0.3189 nm, the lattice constant of AlN is 0.3114 nm, and the lattice constant of InN is 0.3548 nm. Thus, the lattice constant of InGaN has a value corresponding to a composition ratio between the lattice constant of AlN and the lattice constant of InN, and takes a value approximate to the lattice constant of GaN. Here, the forbidden band width of GaN is smaller than that of InGaN, and in one heterojunction unit, the InAlN film which is a film great in forbidden band width is arranged at an upper layer.

With the heterojunction unit of the GaN film and the InAlN film used in this way, the heterojunction units of about 100 pairs are stacked to enable the number of channels to be substantially increased, so that the on-resistance can be further reduced.

Figure 15:
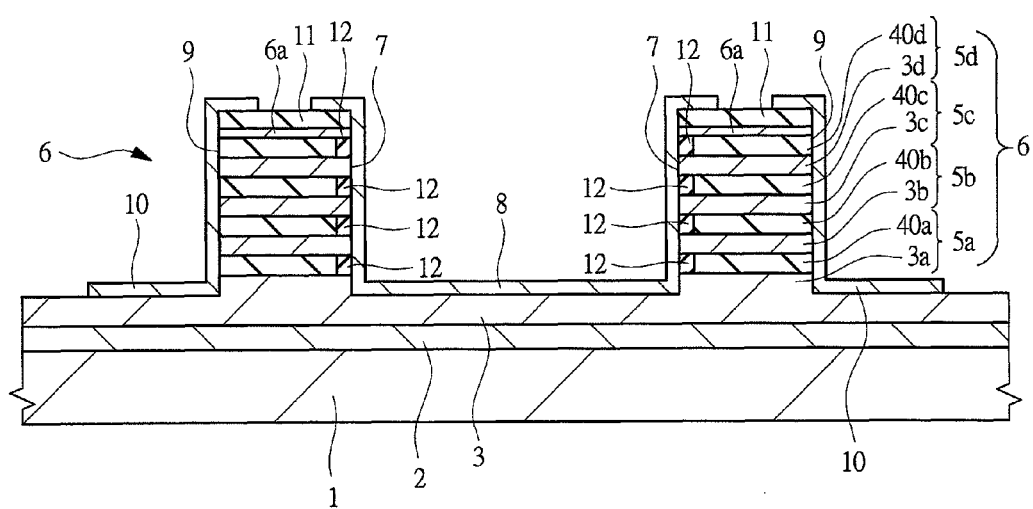
FIG. 15 is a cross-sectional view of a Schottky barrier diode that is a second embodiment of the present invention.

A cross-sectional view of the semiconductor device according to the present embodiment is shown in FIG. 15. A Schottky barrier diode shown in FIG. 15 has the same structure as that of the semiconductor device according to the first embodiment shown in FIG. 8, whereas, as shown in FIG. 15, barrier films 40a, 40b composed of InAlN film instead of AlGaN film are formed on respective upper parts of the GaN films 3a, 3b. In other words, the semiconductor device according to the present embodiment is different in the member of the barrier film from the semiconductor device according to the first embodiment.

Further, heterojunction units 5c, 5d are formed between the barrier film 40b corresponding to the barrier film 4b (see FIG. 8) and the GaN film 6 in order from the substrate 1 side, and the way the heterojunction units 5a to 5c form the stack structure 6 is also different from the first embodiment. In other words, a GaN film 3c and a barrier film 40c stacked on the barrier film 40b in this order constitute the heterojunction unit 5c, and a GaN film 3d and a barrier film 40d stacked on the heterojunction unit 5c in this order constitute the heterojunction unit 5d. This shows that a number of heterojunction units can be stacked in the semiconductor device according to the present embodiment as compared with the semiconductor device according to the first embodiment. In FIG. 15, to make the illustration easy to understand, the heterojunction units 5a to 5d are shown in four layers. However, in practice, stacking of the heterojunction units for about 100 layers may be performed. The oxide films 12 are formed at the interfaces between the respective barrier films 40a to 40d and the first electrode 8.

When the heterojunction unit is constituted by the stacked film of the GaN film and the AlGaN film formed on the GaN film, in the case that a ratio of Al inside the AlGaN film is made larger than 0.25 due to a difference in lattice constant between GaN and AlGaN, the stress inside the heterojunction is increased, and there is a high possibility that a crack develops in the heterojunction unit. The stress becomes larger as the number of stack layers of the heterojunction unit that constitutes the stack structure 6 increases. Consequently, in the Schottky barrier diode stacked with the heterojunction unit composed of the GaN film and the AlGaN film, the crack easily develops when a number of heterojunction units are stacked. Therefore, the number of heterojunction units to be stacked needs to be limited to about three. In other words, in view of securing the reliability of the semiconductor device, when the heterojunction unit is constituted by the stack film of the GaN film and the AlGaN film formed on the GaN film, the number of heterojunction units that can be stacked are limited to about two or three layers.

In contrast to this, similarly to the semiconductor device according to the present embodiment, when the heterojunction unit of the GaN film and the InAlN film is used, the lattice constants of GaN and InAlN are easily equalized, and the stress is hardly generated in the heterojunction unit. Therefore, for example, the stack structure 6 can be formed by a plurality of heterojunction units which are stacked for 1000 layers. Since the thicknesses of the GaN film and InAlN film that constitute the heterojunction unit are about 25 nm, respectively, the thickness of one layer of heterojunction unit is about 50 nm. As described above, the heterojunction unit can be stacked for 1000 layers by preventing the crack from developing, but in the semiconductor device actually used, it is considered, for example, that the heterojunction unit is stacked for 100 layers and the stack structure 6 having the thickness of about 5 μm is formed.

In the semiconductor device according to the present embodiment, a large number of heterojunction units can be formed as compared with the semiconductor device using the heterojunction unit composed of the GaN film and the AlGaN film. Since the number of electron layers (channels) in which electrons pass between the first electrode 8 and the second electrode 10 can be formed more as the number of heterojunction units inside the stack structure 6 are larger, the on-resistance can be reduced.

The semiconductor device according to the present embodiment can be formed by the same process as that of the first embodiment. However, the AlN molar ratio of the barrier film of the first embodiment is about 0.25, while the AlN molar ratio of the semiconductor device according to the present embodiment is about 0.8 and relatively high. Thus, when the oxide film 12 of the first embodiment is formed, ozone radiation is performed, while the oxide film of the barrier film can be formed also by wet oxidation in water-vapor atmosphere in the present embodiment. This is because the barrier film is hardly oxidized by oxidation (wet oxidation) when the Al concentrations of the barrier film are relatively low to a level of about 30%, but when the Al concentrations of the barrier film are relatively high to a level of 70% or more, the surface of the barrier film can be easily oxidized by wet-oxidation. Note that, the respective side surfaces of the GaN films 3a, 3b and the surface of the dry-etched GaN film 3 are hardly deteriorated. That is, upon oxidizing the barrier film, the damages posed on the GaN films can be reduced not by performing ozone radiation using ultraviolet but by performing wet oxidization.

Although the semiconductor device of the comparison example explained with reference to FIG. 16 has a reverse breakdown voltage of 100±10V, the semiconductor device according to the present embodiment has a reverse breakdown voltage of 800±100V of the Schottky barrier diode and can obtain a good reverse breakdown voltage as compared with the semiconductor device of the comparison example. Further, the suppression of the crack development inside the heterojunction unit can allow the heterojunction unit to be stacked for, for example, 100 layers, and can increase the number of channels largely, so that the on-resistance can be reduced.

Consequently, the semiconductor device according to the present embodiment can obtain the effect of reducing the reverse leakage current of the diode similarly to the effect of the first embodiment, and can reduce the on-resistance of the Schottky barrier diode by allowing the heterojunction unit to be staked much more.

In the foregoing, the invention made by the inventors of the present invention has been concretely described based on the embodiments. However, it is needless to say that the present invention is not limited to the foregoing embodiments and various modifications and alterations can be made within the scope of the present invention.

The fabrication method of the semiconductor device according to the present invention can be widely used for semiconductor devices having heterojunction units different in forbidden band width.

What is claimed is:

1. A semiconductor device comprising:
    a stack structure having at least one layer of a heterojunction unit in which a first film and a second film mutually different in forbidden band width are hetero-joined and stacked on a substrate;
    a first electrode arranged so as to contact a first sidewall of the stack structure and forms a Schottky barrier contact with the first film; and
    a second electrode arranged so as to contact a second sidewall opposite to the first sidewall of the stack structure,
    a first insulating film being interposed between the first electrode and the second film.

2. The semiconductor device according to claim 1, wherein the first film contains GaN (gallium nitride), and the second film contains AlGaN (aluminum gallium nitride) or InAlGaN (indium aluminum gallium nitride).

3. The semiconductor device according to claim 1, wherein the stack structure has a plurality of the heterojunction units stacked on the substrate.

4. The semiconductor device according to claim 1, wherein the first insulating film contains an oxide of the second film.

5. The semiconductor device according to claim 1, wherein the second electrode and the second film directly contact each other in the second sidewall.

6. The semiconductor device according to claim 1, wherein the second electrode and the first film are ohmic-connected each other in the second sidewall.

7. The semiconductor device according to claim 1, wherein the first electrode and the second electrode are formed so as to ride over the stack structure, and a GaN (gallium nitride) film is interposed between the first electrode and the second electrode and an upper surface of the stack structure.

8. The semiconductor device according to claim 1, wherein the first electrode and second electrode are formed so as to ride over the stack structure, and the second insulating film is interposed between the first electrode and the second electrode and the upper surface of the stack structure.

9. A fabrication method of a semiconductor device comprising the steps of:
    (a) forming a stack structure by stacking alternately and repeatedly a first film and a second film different in forbidden band width on a substrate;
    (b) forming a first sidewall and a second sidewall opposite to the first sidewall of the stack structure by selectively removing the stack structure;
    (c) forming a first insulating film on a side surface of the second film exposed to the first sidewall;
    (d) forming a first electrode contacting the first sidewall after the step (c), and forming a Schottky barrier contact of the first film and the first electrode; and
    (e) forming a second electrode contacting the second sidewall,
    the first insulating film being interposed between the first electrode and the second film.

10. The fabrication method of a semiconductor device according to claim 9, wherein the first film contains GaN (gallium nitride), and the second film contains AlGaN (aluminum gallium nitride) or InAlGaN (indium aluminum gallium nitride).

11. The fabrication method of a semiconductor device according to claim 9, wherein, in the step (c), the first insulating film containing an oxide of the second film is formed by oxidizing a side surface of the second film exposed to the first sidewall.

12. The fabrication method of a semiconductor device according to claim 11, wherein, in the step (c), the first insulating film is formed by oxidizing the second film by ozone radiation or wet oxidization.

13. The fabrication method of a semiconductor device according to claim 9, wherein, in the step (e), the first film and the second electrode are ohmic-connected.

14. The fabrication method of a semiconductor device according to claim 9, further comprising a step of forming a GaN (gallium nitride) film on the stack structure before the step (b) after the step (a), wherein
    the first electrode is formed on the GaN film in the step (d); and
    the second electrode is formed on the GaN film in the step (e).

15. The fabrication method of a semiconductor device according to claim 9, further comprising a step of forming a second insulating film on the stack structure before the step (b) after the step (a), wherein
    the first electrode is formed on the second insulating film in the step (d); and
    the second electrode is formed on the second insulating film in the step (e).

16. The fabrication method of a semiconductor device according to claim 15, wherein the second insulating film immediately below the first electrode and the second insulating film immediately below the second electrode are isolated from each other by partially removing the second insulating film after the step (d) and the step (e).

* * * * *